United States Patent
Daamen et al.

(10) Patent No.: US 7,510,959 B2
(45) Date of Patent: Mar. 31, 2009

(54) METHOD OF MANUFACTURING A SEMICONDUCTOR DEVICE HAVING DAMASCENE STRUCTURES WITH AIR GAPS

(75) Inventors: Roel Daamen, Posterholt (NL); Viet Nguyen Hoang, Delft (NL)

(73) Assignees: Interuniversitair Microelektronica Centrum (IMEC), Leuven (BE); Koninklikje Phillips Electronics, BA Eindhoven (NL)

( * ) Notice: Subject to any disclaimer, the term of this patent is extended or adjusted under 35 U.S.C. 154(b) by 301 days.

(21) Appl. No.: 11/083,344

(22) Filed: Mar. 16, 2005

(65) Prior Publication Data

US 2005/0215047 A1    Sep. 29, 2005

(30) Foreign Application Priority Data

Mar. 17, 2004    (EP)    ................................. 04101097

(51) Int. Cl.
   *H01L 21/4763*    (2006.01)
(52) U.S. Cl. ........................ 438/619; 438/623; 438/624; 438/631; 438/639; 438/643; 438/645; 438/690; 438/781; 438/795; 438/799
(58) Field of Classification Search ................. 438/619, 438/623, 624, 631, 639, 643, 645, 690, 781, 438/795, 799
See application file for complete search history.

(56) References Cited

U.S. PATENT DOCUMENTS

| | | | | |
|---|---|---|---|---|
| 4,987,101 A | * | 1/1991 | Kaanta et al. | ................ 438/619 |
| 5,380,546 A | * | 1/1995 | Krishnan et al. | ......... 427/126.1 |
| 6,071,809 A | | 6/2000 | Zhao et al. | |
| 6,867,125 B2 | * | 3/2005 | Kloster et al. | ................ 438/618 |
| 2002/0145201 A1 | * | 10/2002 | Armbrust et al. | ............ 257/776 |

FOREIGN PATENT DOCUMENTS

WO    WO 02/19416    3/2002

* cited by examiner

*Primary Examiner*—Thanh V Pham
(74) *Attorney, Agent, or Firm*—Knobbe Martens Olson & Bear, LLP

(57) ABSTRACT

A method of manufacturing a semiconductor device having damascene structures with air gaps is provided. In one embodiment, the method comprises the steps of depositing and patterning a disposable layer, depositing a first barrier layer on top of the patterned disposable layer, depositing a metal layer, planarizing the metal layer, depositing a second barrier layer, planarizing the second barrier layer until substantially no barrier layer material is present on top of the disposable layer, depositing a permeable layer, removing the disposable layer through the permeable layer to form air gaps.

12 Claims, 4 Drawing Sheets

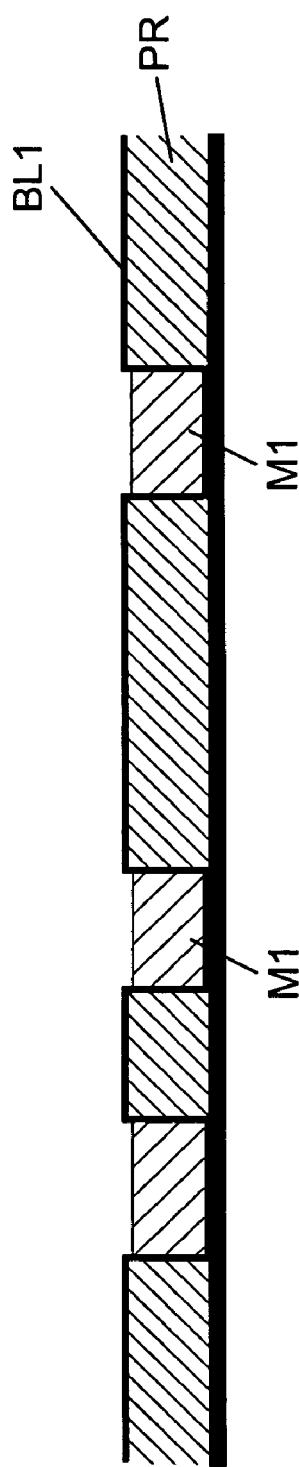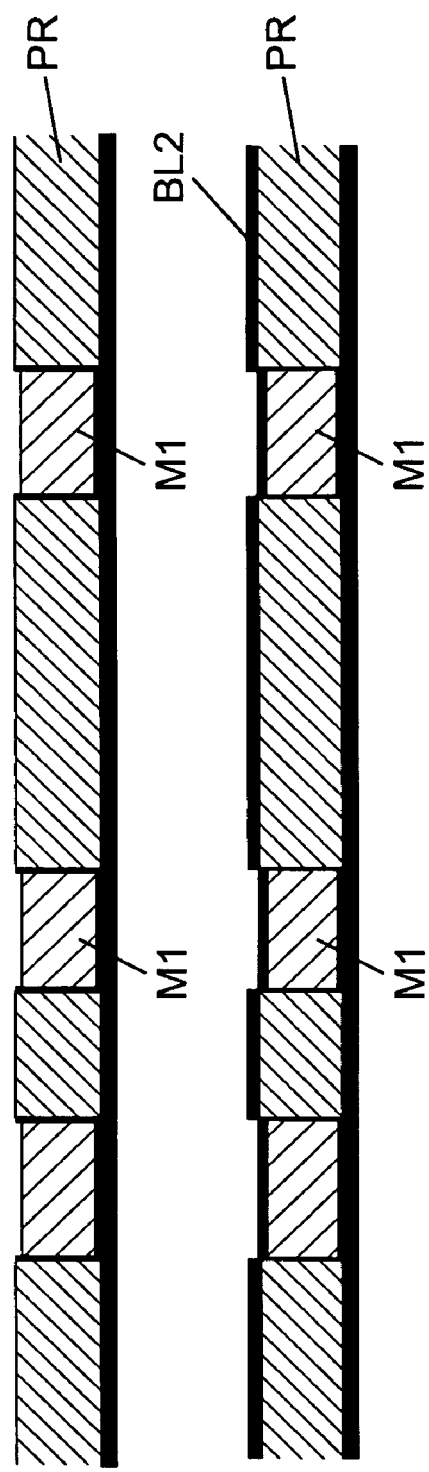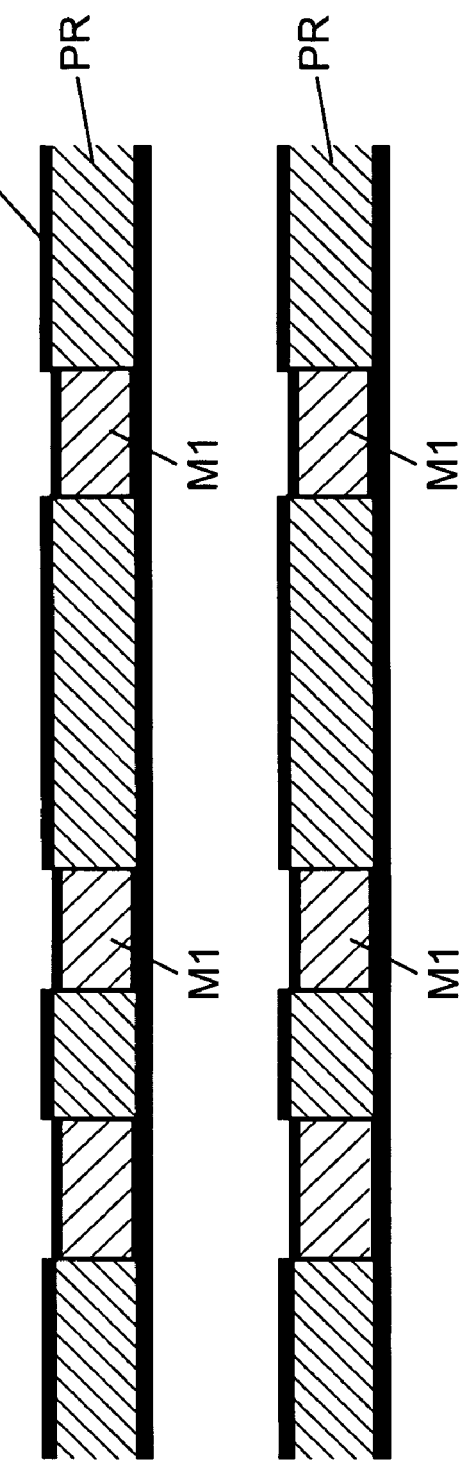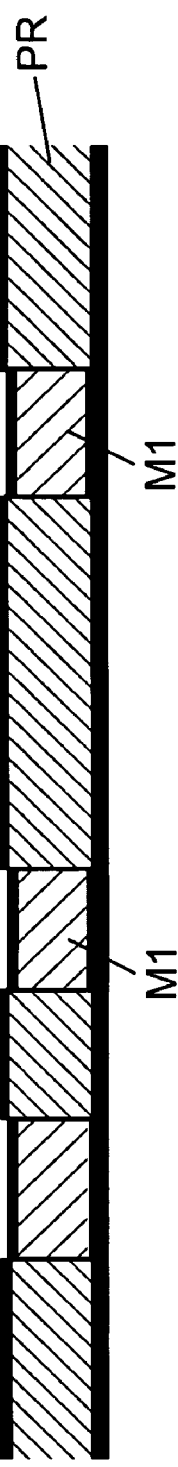

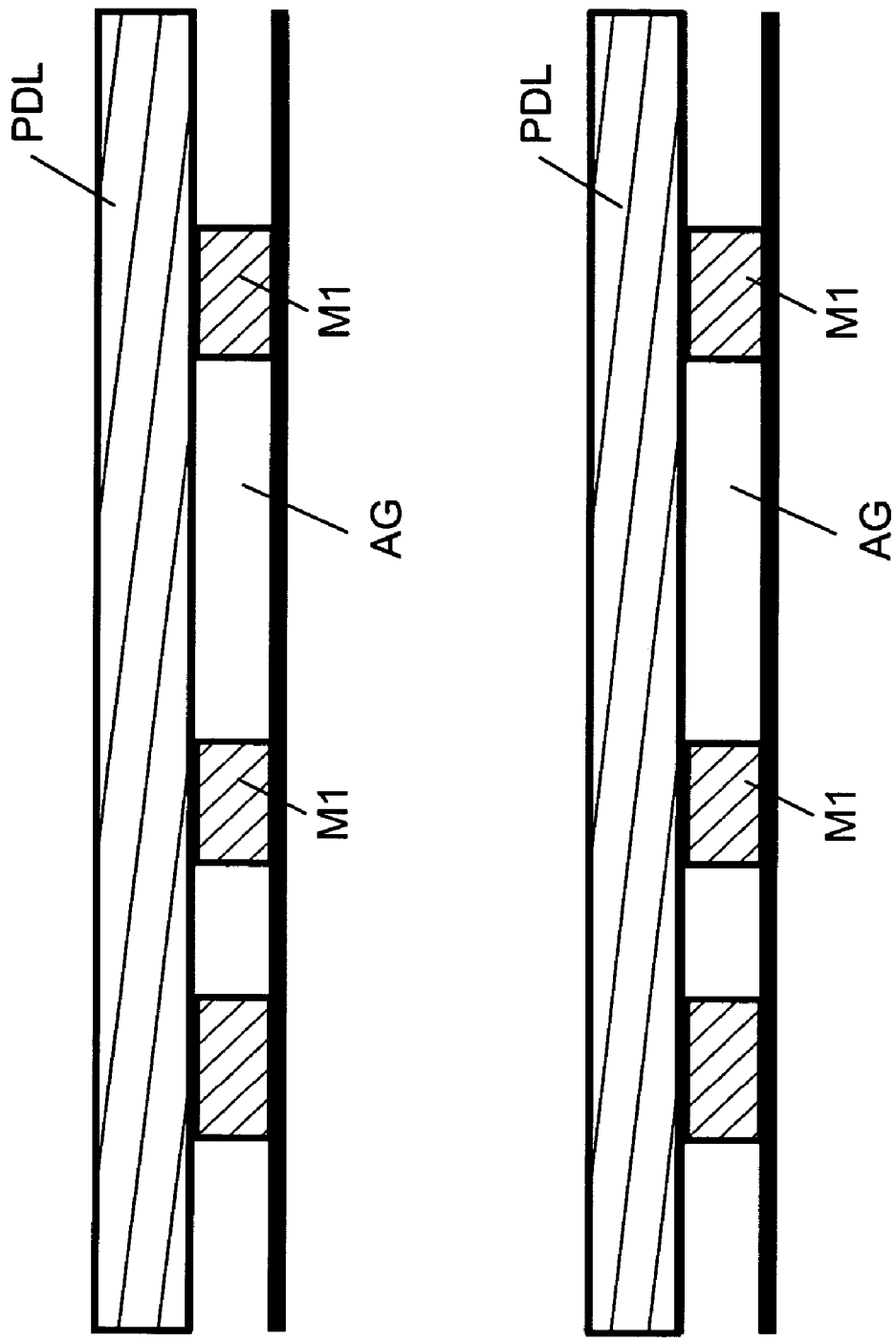

METHOD OF MANUFACTURING A SEMICONDUCTOR DEVICE HAVING DAMASCENE STRUCTURES WITH AIR GAPS

BACKGROUND OF THE INVENTION

1. Field of the Invention

The invention relates to a method of manufacturing a semiconductor device having damascene structures with air gaps as well as to a semiconductor device thus manufactured.

2. Description of the Related Technology

The trend towards integrated circuits with deep submicron technology (i.e., involving feature sizes of less than 0.35 microns) has increased the need for multi-layer interconnects. The performance of integrated circuits in the deep submicron regime is increasingly dependent on the communication delay, i.e., the delay time of electronic signals traveling between the millions of gates and transistors present on the typical integrated circuits. As a result, capacitance and resistance effects resulting from the passive interconnect structures are increasingly becoming important and do have to be well-controlled.

One way to solve the above problems is to use low resistance metals (e.g., copper) in conjunction with insulating materials with low dielectric constants ("low-k dielectrics") between metal lines. A low-k dielectric is a dielectric material which exhibits a substantially lower dielectric constant than conventional dielectric materials such as silicon dioxide.

Based on considerable efforts optical lithography techniques have been able to keep up with deep submicron requirements using techniques such as off-axis illumination, phase shifting masks, and other methods known in the art. However, the achieved increase in resolution comes at the expense of a decrease in the depth of focus. Therefore, highly planar surfaces are required during intermediary process steps. To achieve highly planar surfaces, traditional metal deposition and photolithographic techniques become progressively more ineffective as line widths are scaled down and multiple layers of metal are used.

Chemical-Mechanical Polishing (CMP) is increasingly being used in the fabrication of interconnect layers for modern integrated circuits especially with more than three layers. The metal lines thereof usually comprise a high aspect ratio (e.g., lines in the order of 0.25 µm in width and in the order of 1.0 µm in height). For more details on CMP please refer to the introductory part of U.S. Pat. No. 6,071,809.

A typical semiconductor manufacturing technique based on CMP techniques is the so-called damascene process. A damascene process comprises the steps of forming patterns in a dielectric layer, filling these patterns with an interconnect metal, removing the excess metal on the wafer surface by polishing and leaving inlaid interconnect metal features.

Basically two damascene processes exist, namely the single-damascene and the dual-damascene process. In a single damascene process, a lower conductor is formed on a substrate and is coated with a first dielectric layer. The lower conductor is contacted by patterning the first dielectric layer and forming a conductive plug in the first dielectric layer. Thereafter, a second dielectric layer deposited on the first dielectric layer is patterned and an interconnect wiring metallization is formed in the patterned second dielectric layer. In addition a dielectric is deposited, the structures are etched and the metal is filled and planarized resulting in inlaid metal structures. During the fabrication and the interconnecting using single damascene processing, every layer is formed separately, i.e., a single damascene trench level followed by single damascene via level. However, in a dual-damascene process, the interconnect metal wiring and the conductive plug are formed by patterning both the via and the trench patterns into the first dielectric layer. Thereafter, the via and the trench are filled simultaneously with metal. The dual damascene process provides a simple and low-cost manufacturing technique.

Copper is preferred over aluminum for interconnect metallization as its conductivity is relatively high, i.e., low resistance, and it is less susceptible to electro-migration failure than many other metals. On the other hand, the use of Cu as interconnect metal introduces new problems, since bringing copper into contact with silicon or silicon dioxide may lead to devastating results. This is because copper migrates or diffuses into the silicon dioxide, thereby increasing leakage currents or actually shorting-out adjacent conductors. Accordingly, some kind of Cu diffusion barriers around copper conductors must be introduced. In the above damascene structures, the inner surfaces (i.e., the bottom and sides of the via and trench) are typically coated with a thin layer of Ti, TiN, Ta, TaN, WN or another adequate barrier metal. The top surface of a Cu conductor is then typically capped with a layer of silicon nitride or another barrier material after the inlaid Cu conductors are formed by CMP. Silicon nitride, silicon carbide or silicon carbonitride is typically used as it is an effective diffusion barrier for copper.

In U.S. Pat. No. 6,071,809 a typical prior art low-k dual-damascene structure is shown, which includes copper conductors formed on a substrate with a dielectric (e.g., silicon dioxide or a low-k dielectric). A nitride cap layer is formed on copper conductors, which is followed by a low-k dielectric layer, an etch stop silicon dioxide layer, a second low-k dielectric layer, and a hard mask silicon dioxide layer. Using standard etching techniques, vias and trenches are patterned in the low-k dielectrics, and the copper interconnect metal and any seed and barrier layers are deposited to form the connection to conductors. The cap layer typically consists of silicon nitride and the hard mask layer typically consists of silicon dioxide.

Usually, advanced low-k materials have a bulk k-value of approximately 2, while air has a k-value of 1. Therefore, the use of air gaps instead of low-k materials would lead to a significant reduction of parasitic capacitance. One example of a damascene structure with air gaps is shown in WO 02/19416. A standard dual damascene structure is manufactured as described in U.S. Pat. No. 6,071,809. The dual damascene structure comprises a metal layer, a first dielectric layer as via dielectric (low-k dielectrics such as siloxane or a polyarylene ether), a second dielectric layer (such as SOG, Nanoglass™ or a polymer like SiLK) disposed on the first dielectric layer as trench level dielectric with an interconnect groove. In addition, an etch stop layer (such as SiN) is present between the first dielectric layer and the second dielectric layer. Metal, preferably copper (Cu), fills the via and the interconnect groove, forming a metal line having an upper side. A barrier and the Cu seed layer is provided on the walls of the via and the interconnect groove before depositing the Cu. The second dielectric layer is removed so that the metal which has filled the interconnect grove at trench level is laid open, i.e., the second dielectric layer is used as a sacrificial layer for defining the metal lines. A non-conductive barrier layer (such as silicon nitride or silicon carbide) is provided over the laid open metal line and the laid open etch stop layer. A disposable layer is deposited on the etch stop layer and the metal line. Thereafter, the disposable layer is planarized down to the upper side of the metal line. A porous dielectric layer is spun on the disposable layer, and the disposable layer is removed or decomposed through the porous dielectric layer in order to form air gaps. The air gaps are obtained through a curing and baking step possibly assisted with UV treatment.

The spin-on material of the porous dielectric layer comprises a polymer which can be volatilized or degraded to smaller molecules, like PMMA (polymethyl methacrylate), polystyrene, and polyvinyl alcohol. Alternatively, a UV photoresist may also be used as the basic material for the manufacture of air gaps, and a plasma CVD layer or a spin-on dielectric layer is used for the porous dielectric layer. The porous dielectric layer preferably comprises a low-k dielectric such as SiLK, provided in a spin coating process. A plasma CVD layer may also be used as the porous dielectric layer.

SUMMARY OF CERTAIN ASPECTS OF THE INVENTION

One aspect of the invention provides an improved method of manufacturing a semiconductor device with damascene structure and air gaps.

Another aspect of the invention provides a semiconductor device manufactured by the method.

In one embodiment, the method comprises: depositing and patterning a disposable layer, depositing a first barrier layer on top of the patterned disposable layer, depositing a metal layer, planarizing the metal layer, depositing a second barrier layer, planarizing the second barrier layer until substantially no barrier layer material is present on top of the disposable layer, depositing a permeable layer, removing the disposable layer through the permeable layer to form air gaps.

As a result of the introduction of a second barrier layer, the metal lines are encapsulated and passivated without a barrier layer causing a decrease of the available air gaps space or an increase of the effective k-value of the air gap leading to higher unwanted RC-delays.

In one embodiment, the first and second barrier layers (BL1, BL2) comprise conductive material.

In one embodiment, the disposable layer is formed of a photoresist layer or an organic polymer with a low mass. Such a disposable layer can be easily decomposed by heating the structure, leading to an effective way of creating the air gaps.

In one embodiment, the patterning and etching of the disposable layer is adapted to form additional patterns in the disposable layer to provide metal dummy structures in the disposable layer after the removing. These metal dummy structures improve the mechanical stability of the air gaps.

In one embodiment, a single CVD reactor is used for performing the removing by heating in order to decompose the disposable layer and for depositing a dielectric layer thereafter. Thus, the usage of a stand-alone oven for decomposing the disposable layer can be omitted, thereby decreasing the required amount of apparatus and increasing the throughput.

Another aspect of the invention provides a semiconductor device having damascene structures with air gaps. In one embodiment, the semiconductor device comprises a patterned disposable layer with a first barrier layer between the patterned disposable layer and a planarized metal layer, wherein a second barrier layer is formed on top of the metal layer without covering the disposable layer. A permeable layer is deposited on top of the metal layer and the disposable layer, and the disposable layer is removed through the permeable layer, thereby forming air gaps.

One embodiment of the invention is based on the idea to use a conductive barrier material to encapsulate and passivate merely the metal lines without covering the disposable layer by means of two barrier deposition steps.

Other aspects of the inventions will be described below.

BRIEF DESCRIPTION OF THE DRAWINGS

These and other aspects of the invention are apparent from and will be elucidated with reference to the embodiment(s) described hereinafter.

FIGS. 1 to 9 show a number of processing steps according to a method of manufacturing a semiconductor device in one embodiment.

FIG. 1 shows a cross section of a semiconductor device according to one embodiment of the invention as a starting point.

FIG. 2 shows a cross section of the device of FIG. 1 after patterning the deposited photoresist layer.

FIG. 3 shows a cross section of the device of FIG. 2 after a first barrier layer deposition and a seed layer deposition.

FIG. 4 shows a cross section of the device of FIG. 3 after a metal plating step.

FIG. 5A shows a cross section of the device of FIG. 4 after a planarization step, which leaves the barrier layer intact.

FIG. 5B shows a device of FIG. 4 after a planarization step, which removes the barrier layer on top of the photoresist layer.

FIGS. 6A and 6B show a cross section of the device of FIGS. 5A and 5B after a second barrier deposition.

FIGS. 9A and 9B show a cross section of the device of FIGS. 8A and 8B, respectively, after decomposing the photoresist layer.

DETAILED DESCRIPTION OF CERTAIN INVENTIVE EMBODIMENTS

Figure 1:
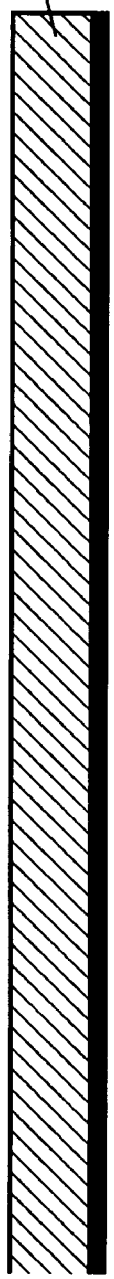

FIG. 1 shows a cross section of a semiconductor device as a starting point for the manufacturing process according to a first preferred embodiment of the invention. In particular, a photoresist PR is deposited on a first layer. This deposition is preferably performed by spin-coating. Alternatively, other starting points may be possible.

Figure 2:
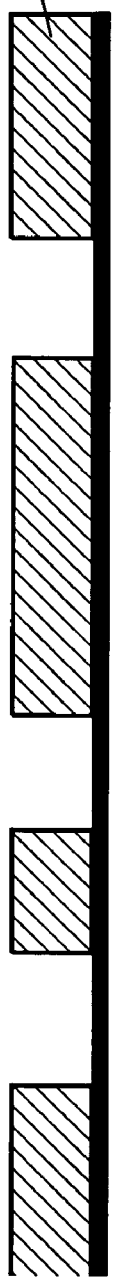

FIG. 2 shows a cross section of the device of FIG. 1 after the photoresist PR was patterned. This can be performed by means of known lithography processes.

Figure 3:
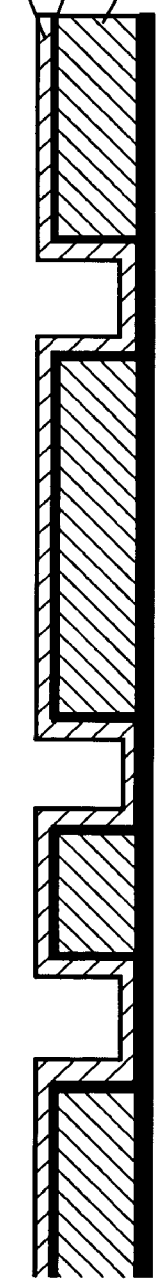

FIG. 3 shows a cross section of the device of FIG. 2 after a first diffusion barrier layer deposition and a seed layer deposition. The first diffusion barrier layer deposition and the Cu seed layer deposition are performed by physical vapor deposition PVD, CVD or ALCVD or a combination of those techniques. The first barrier layer BL1 may comprise a conductive material like tungsten nitride, titanium, titanium nitride, titanium silicide, tantalum, tantalum nitride or other materials which prevent the diffusion of metal items between unlike materials. The seed layer may comprise copper.

Figure 4:
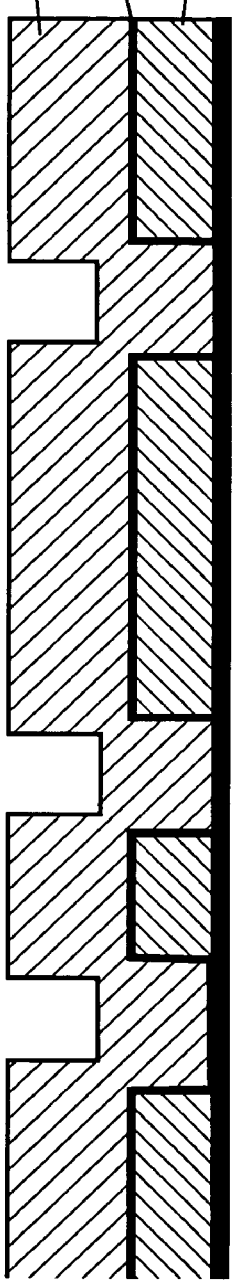

FIG. 4 shows a cross section of the device of FIG. 3 after a well-known copper plating step.

FIG. 5A shows a cross section of a device of FIG. 4 after a planarization step. The planarization of copper is performed by chemical mechanical polishing CMP. This polishing is performed until the first diffusion barrier layer BL1 is exposed.

FIG. 5B shows a cross section of the device of FIG. 4 after a planarization step. The planarization of the metal is performed by chemical mechanical polishing CMP. The polishing is continued until the copper as well as the first barrier layer BL1 on top of the photoresist PR is removed.

FIGS. 6A and 6B show cross sections of a device of FIGS. 5A and 5B, respectively, after a second diffusion barrier layer deposition step. The second diffusion barrier layer deposition may be performed in the same manner as the first diffusion barrier layer deposition, as described with regard to FIG. 3. The second barrier layer BL2 may comprise a conductive material like tungsten nitride, titanium, titanium nitride, titanium silicide, tantalum, tantalum nitride or other materials which prevent the diffusion of metal items between unlike materials.

Figure 7A:
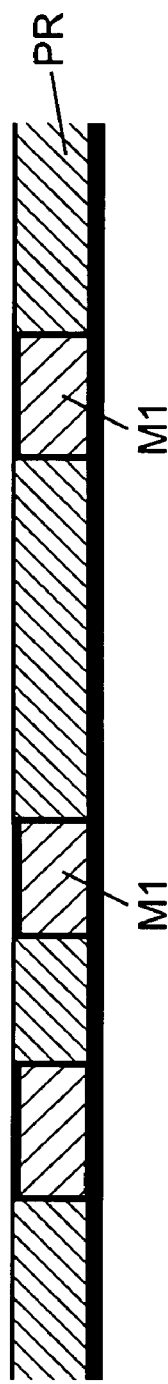
FIGS. 7A and 7B show a cross section of the device of FIGS. 6A and 6B after removing the barrier layer from the photoresist layer.
Figure 7B:
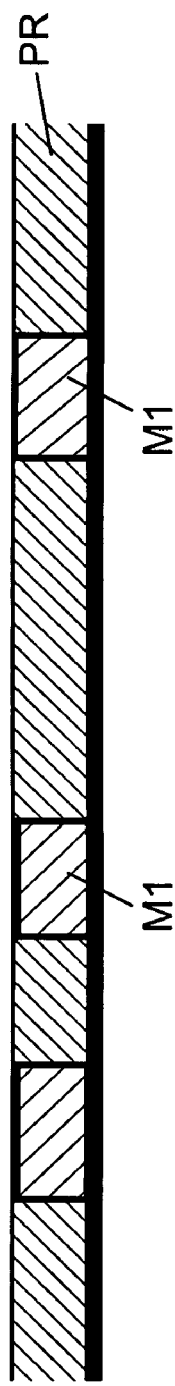

FIGS. 7A and 7B show cross sections of the device of FIGS. 6A and 6B, respectively, after removing the second barrier layer BL2 on top of the resist PR. This is performed again by means of chemical mechanical polishing CMP or dry etching. The polishing is continued until the barrier layer on top of the photoresist PR is removed. However, the second barrier layer BL2 will remain present on top of the metal layer M1. Thus, the metal layer M1 is encapsulated and passivated by the first diffusion layer BL1 covering the bottom and the side walls as well as by the second barrier layer BL2 covering the top parts of the metal layer.

Figure 8A:
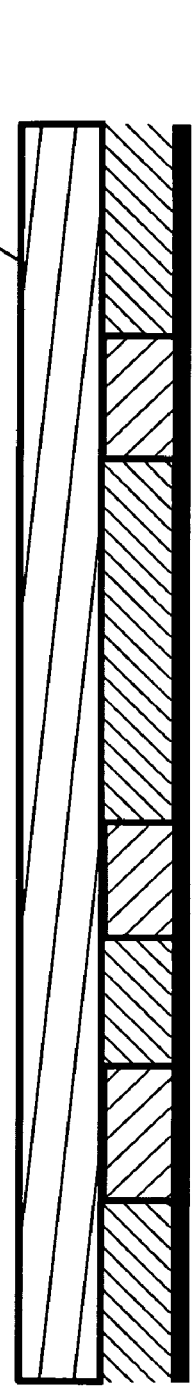
FIGS. 8A and 8B show a cross section of the device of FIGS. 7A and 7B, respectively, after depositing a permeable dielectric layer.
Figure 8B:
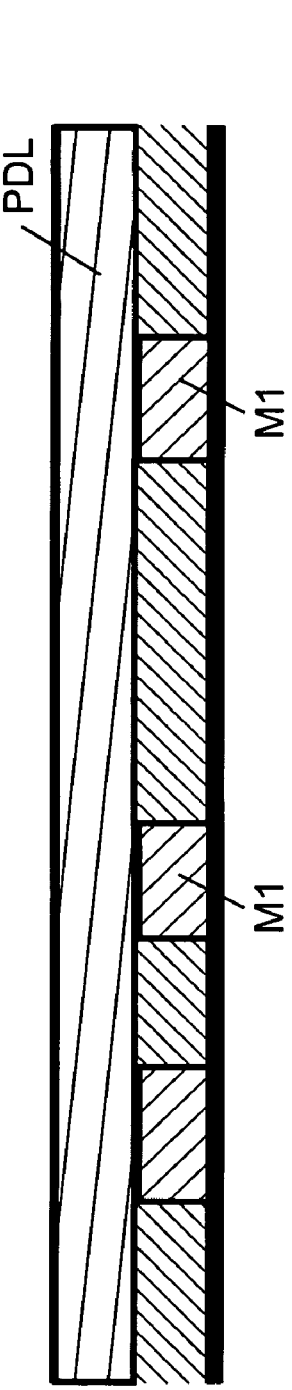

FIGS. 8A and 8B show cross sections of the devices of FIGS. 7A and 7B, respectively, after depositing a permeable dielectric layer PDL on top. This dielectric material is preferably porous as well as permeable and has a low-k value. The deposition is performed by spin coating on the CMP-treated surface of the photoresist and the second barrier layer BL2 on top of the metal layer. Alternatively, a PECVD deposition is also possible to deposit a porous dielectric layer.

FIGS. 9A and 9B show cross sections of the devices of FIGS. 8A and 8B, respectively, after decomposition of the photoresist layer PR. The photoresist layer is used as a sacrificial material. It is decomposed by heating the wafer. The photoresist PR decomposes and diffuses through the permeable dielectric material. Finally, the air gaps AG are present in the volume occupied previously by the decomposed material.

In other words, the copper layer is capped before the permeable via-layer is deposited. However, also other capping methods may be implemented, like self-aligned electroless barrier deposition, such as CoWP or CoWB and even an SiC/Si3N4 etc. deposition followed by a lithography step and an etch step removing a liner from the top of the spacing, but leaving it on the copper, thus capping/passivating this layer.

The above mentioned semiconductor manufacturing process may be used in all CMOS, RFCMOS and BiCMOS processes.

A semiconductor device manufactured as described above will differ from prior art semiconductor devices as a very small amount of carbon-like material may be found inside the air gaps. In particular the carbon-like material may be found at the interface of the barrier layer protecting the copper. However, by process optimization almost totally clean air gaps can be achieved, especially by the use of cleaner air gap material or the use of special cleaning techniques, such as supercritical cleaning methods. In addition, the copper line will be totally encapsulated by the conductive barrier layer material.

According to a second embodiment which is based on the first embodiment, metal dummies are introduced into the air gaps to increase the mechanical stability thereof. This may be achieved by adapting the lithography step as depicted in FIG. 2 such that additional gaps are introduced into the resist layer PR. These additional gaps should be formed between the metal lines to be manufactured. Thereafter, the diffusion barrier layer deposition, the seed layer deposition and the subsequent processing steps as described according to the first embodiment are performed. Since the additional gaps in the photoresist are arranged at positions in between the metal lines M1 and are filled with copper, the copper in the additional trenches is not interconnected with other metal lines and thus merely serves for increasing the stability of the air gaps.

According to a third embodiment, which may be based on the first or second embodiment, the throughput of the air gap formation process is increased by using the same CVD reactor for performing the heating step to decompose the disposable layer and for depositing the dielectric layer of a subsequent step. Preferably, the heating is performed under an inert gas environment, like a nitrogen environment. Thus, the usage of a stand-alone oven for the decomposition of the disposable layer can be omitted, thereby decreasing the required amount of apparatus and increasing the throughput. In other words, only one CVD reactor is used for decomposing the sacrificial layer to form the air gap and for subsequently depositing a CVD dielectric layer with a low k-value.

Instead of the photoresist used as a disposable layer in the above embodiments, any organic polymer with a low mass, i.e. low amu, that decomposes somewhere between about 300-500° C., preferably between about 350-450° C., may be chosen, since this layer will be decomposed.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A method of manufacturing a semiconductor device having a damascene structure with air gaps, comprising:
   depositing and patterning a disposable layer;
   depositing a first barrier layer on the patterned disposable layer;
   depositing a metal layer on the first barrier layer and between the patterned portions of the disposable layer;
   planarizing the metal layer;
   depositing a second barrier layer on the planarized metal layer and the patterned portions of the disposable layer;
   planarizing the second barrier layer until substantially no barrier layer is present on top of the patterned portions of the disposable layer;
   depositing a permeable dielectric layer on the planarized second barrier layer and the patterned portions of the disposable layer; and
   removing the patterned portions of the disposable layer through the permeable dielectric layer so as to form air gaps, wherein the removing comprises heating the disposable layer so that the patterned portions decompose and diffuse through the permeable dielectric layer, and wherein a single CVD reactor is used for depositing the permeable dielectric layer and for removing of the patterned portions of the disposable layer by heating in order to decompose the disposable layer.

2. The method according to claim 1, wherein the first and second barrier layers comprise conductive material.

3. The method according to claim 1, wherein the disposable layer is a photoresist layer or an organic polymer with a low mass.

4. The method according to claim 1, further comprising etching the disposable layer, wherein the patterning and etching of the disposable layer is adapted to form additional patterns in the disposable layer to provide metal dummy structures in the disposable layer after the removing of the patterned portions of the disposable layer.

5. The method of claim 2, wherein the conductive material comprises at least one of the following: tungsten nitride, titanium, titanium nitride, titanium silicide, tantalum and tantalum nitride.

6. A method of manufacturing a semiconductor device having damascene structures with air gaps, the method comprising:
   depositing a first barrier layer on a patterned disposable layer, wherein the disposable layer includes a plurality of patterned portions;
   forming a planarized metal layer between the plurality of patterned portions of the disposable layer;
   forming a second barrier layer on top of the metal layer, without covering the plurality of patterned portions of the disposable layer;
   depositing a permeable layer on the metal layer and the plurality of patterned portions of the disposable layer; and
   removing the plurality of patterned portions of the disposable layer through the permeable layer, so as to form air gaps therein, wherein the removing comprises heating the disposable layer so that the patterned portions decompose and diffuse through the permeable dielectric layer, and wherein a single CVD reactor is used for depositing the permeable layer and for removing of the plurality of patterned portions of the disposable layer by heating in order to decompose the disposable layer.

7. The method of claim 6, wherein the first and second barrier layers comprise conductive material.

8. The method of claim 6, wherein the conductive material comprises at least one of the following: tungsten nitride, titanium, titanium nitride, titanium silicide, tantalum and tantalum nitride.

9. The method of claim 1, wherein no openings are formed in the permeable dielectric layer so as to remove the patterned portions of the disposable layer.

10. The method of claim 6, wherein no openings are formed in the permeable dielectric layer to remove the patterned portions of the disposable layer.

11. The method of claim 1, wherein the disposable layer is heated at a temperature between 300° C.-500° C.

12. The method of claim 6, wherein the disposable layer is heated at a temperature between 300° C.-500° C.

* * * * *

UNITED STATES PATENT AND TRADEMARK OFFICE
CERTIFICATE OF CORRECTION

PATENT NO. : 7,510,959 B2  Page 1 of 1
APPLICATION NO. : 11/083344
DATED : March 31, 2009
INVENTOR(S) : Roel Daamen and Viet Nguyen Hoang It is certified that error appears in the above-identified patent and that said Letters Patent is hereby corrected as shown below:

On the Title Page, Item 73 (Assignees), Line 3, delete "Koninklikje", and insert --Koninklijke--, therefore.

Signed and Sealed this

First Day of September, 2009

David J. Kappos
*Director of the United States Patent and Trademark Office*